US006934152B1

(12) United States Patent
Barrow

(10) Patent No.: US 6,934,152 B1
(45) Date of Patent: Aug. 23, 2005

(54) SYSTEMS AND METHODS FOR CONNECTING AN ELECTRONIC APPARATUS TO A BACKPLANE

(75) Inventor: Jonathan J. Barrow, Franklin, MA (US)

(73) Assignee: EMC Corporation, Hopkinton, MA (US)

( * ) Notice: Subject to any disclaimer, the term of this patent is extended or adjusted under 35 U.S.C. 154(b) by 199 days.

(21) Appl. No.: 10/608,618

(22) Filed: Jun. 27, 2003

(51) Int. Cl.[7] .............................................. H05H 7/20
(52) U.S. Cl. ...................... 361/690; 361/695; 361/721; 361/804; 361/704; 361/736; 361/742; 361/744; 165/80.3
(58) Field of Search ........................ 361/679, 687–695, 361/704, 707, 709–710, 715, 719–721, 742, 361/758, 744, 736–737, 796, 801–806, 725–727; 439/64, 65, 55, 69, 485; 454/184; 165/80.3, 165/121, 122, 185

(56) References Cited

U.S. PATENT DOCUMENTS

| | | | |
|---|---|---|---|
| 4,998,180 A * | 3/1991 | McAuliffe et al. .......... 361/684 |
| 5,214,570 A * | 5/1993 | Shah et al. .................. 361/684 |
| 5,768,104 A * | 6/1998 | Salmonson et al. ......... 361/704 |
| 6,411,511 B1 * | 6/2002 | Chen .......................... 361/697 |
| 6,430,052 B1 | 8/2002 | Kordes et al. .............. 361/719 |
| 6,482,042 B1 | 11/2002 | Tupper ....................... 439/638 |
| 6,509,752 B1 | 1/2003 | O'Keeffe et al. ........... 324/754 |
| 6,623,177 B1 | 9/2003 | Chilton ....................... 385/88 |
| 6,728,104 B1 | 4/2004 | Ahmad et al. .............. 361/704 |
| 6,773,269 B1 | 8/2004 | Downes ...................... 439/75 |

* cited by examiner

Primary Examiner—Gregory Thompson
(74) Attorney, Agent, or Firm—David E. Huang, Esq.

(57) ABSTRACT

An electronic apparatus includes a first assembly and a second assembly. Each assembly has a circuit board defining a front side and a back side, a set of connectors mounted to the front side of that circuit board, and a heat sink disposed over the front side of that circuit board. The heat sink is configured to provide cooling to that assembly. The electronic apparatus further includes a coupling mechanism that couples the first and second assemblies together in a substantially parallel manner. The sets of connectors of the assemblies form a connection interface to concurrently connect the first and second assemblies to a backplane.

18 Claims, 4 Drawing Sheets

SYSTEMS AND METHODS FOR CONNECTING AN ELECTRONIC APPARATUS TO A BACKPLANE

BACKGROUND

A conventional backplane-based electronic system typically includes a card cage, a backplane and multiple circuit board modules. The card cage typically defines a front opening, a back opening and a set of parallel slots leading between the front opening and the back opening. The backplane typically resides adjacent the back opening of the card cage.

During setup, a technician typically installs each circuit board module within the card cage. In particular, for each circuit board module, the technician slides that circuit board module through the front opening of the card cage and into a respective card cage slot. The technician typically pushes that circuit board module until a column of circuit board connectors along the leading edge of that circuit board module connects with a corresponding column of backplane connectors of the backplane.

When setup is complete, the circuit board modules reside within the card cage in a parallel manner. The parallel orientation of the circuit board modules alleviates the need for manufacturers to provide multiple air streams to the card cage in order to remove heat from the system. Rather, a manufacturer can design the system to use a single fan assembly that provides a single air stream through parallel spaces between the modules.

After setup is complete, the electronic system is ready for operation. At this point, the backplane provides a high density connection medium for carrying an assortment of signals to and from the circuit board modules. In particular, the backplane carries power supply signals from a power supply, or from a set of power buses, to each module. Additionally, the backplane carries data signals between the modules thus enabling the modules to communicate with each other to perform a variety of operations such as data processing operations, network interfacing operations, data storage operations, etc.

It should be understood that manufacturers of backplane-based electronic systems often attempt to squeeze the various system components into a very tight space. For example, such high-density designs enable manufacturers to market their products as compact systems which fit into relatively small footprints thus minimizing the amount of space needed at customer sites. Additionally, such designs may enable the manufacturer to reduce manufacturing costs since less materials are needed to make the smaller systems.

During the product lifecycle, manufacturers of backplane-based electronic systems may make enhancements to their initial designs. For example, using faster processing circuitry, a manufacturer may develop a faster circuit board module that performs the same operations as an older module but in less time, or the manufacturer may develop a new circuit board module that performs different and more-complex operations which are beyond the reasonable capabilities of the older module. The manufacturer may wish to offer modules having this faster processing circuitry to both its new customers, as well as its installed customer base in the form of an upgrade.

Since faster processing circuitry typically requires higher power, such faster processing circuitry often needs larger heat sinks to provide sufficient cooling. In some situations, due to the limited amount of space between columns of backplane connectors and due to the placement of the circuit board connectors of the circuit board modules, there may not be enough space between the circuit board modules to easily accommodate the larger heat sinks. There are a variety of conventional approaches to upgrading backplane-based electronic systems to use circuit board modules with larger heat sinks while preserving the use of the same backplane.

One conventional approach to upgrading a backplane-based electronic system to use a circuit board module with a larger heat sink while preserving the use of the same backplane (hereinafter called the module removal approach) is for the user to remove the circuit board module adjacent the circuit board module undergoing the upgrade, and then to replace the circuit board module undergoing the upgrade with a new circuit board module having the faster processing circuitry and the larger heat sink. In this approach, the user understands that the sacrifice for upgrading the existing module to the new circuit board module is the loss of the adjacent module.

Another approach to upgrading a backplane-based electronic system to use a circuit board module with a larger heat sink while preserving the use of the same backplane (hereinafter called the piggy-back approach) is for the user to replace two existing circuit board modules with a new primary/secondary circuit board module having a primary circuit board that supports a column of circuit board connectors, and a secondary circuit board that connects to the primary circuit board in a parallel manner. In this approach, the user essentially upgrades one of the existing circuit board modules by replacing that module with the primary circuit board. The user also preserves some of the functionality of the other existing circuit board module by replacing that module with the secondary circuit board. However, the user still loses the full connectivity provided by the two existing circuit board modules since the new primary/secondary circuit board module has only one column of circuit board connectors.

SUMMARY

Unfortunately, there are deficiencies to the above-described conventional approaches to upgrading a backplane-based electronic system to use a circuit board module with a larger heat sink while preserving the use of the same backplane. For example, in connection with the above-described conventional module removal approach, the user losses the entire functionality of the circuit board module that is removed in order to accommodate the upgraded circuit board having the faster processing circuitry and the larger heat sink. That is, with the adjacent module removed, the system loses the circuit board space and circuitry on that space. If the sacrificed circuit board module was a processor module, the processing power of that module is now lost. Alternatively, if the sacrificed circuit board module was a memory module, the storage capacity of that module is lost, and so on.

Similarly, in connection with the above-described conventional piggy-back approach, the user loses the full connectivity offered by the two earlier-existing circuit board modules since the new primary/secondary circuit board module has only one column of circuit board connectors. Such a sacrifice is particularly painful if the backplane does not provide multi-drop connectivity (as in multi-drop buses) but instead provides point-to-point connectivity. That is, the loss of connectivity in a point-to-point architecture essentially results in loss of an entire module. Such a loss is thus essentially equivalent to removing an entire circuit board module as in the module removal approach.

Embodiments of the invention are directed to techniques for connecting multiple circuit board assemblies to a backplane where the circuit boards of the assemblies are coupled together in a substantially parallel manner, and where connectors of the assemblies form a connection interface to concurrently connect the assemblies to the backplane. Such techniques enable large heat sinks to be disposed between the circuit boards for sufficient cooling of fast processing circuitry, and further enable the use of multiple columns of circuit board connectors to simultaneously connect with multiple columns of backplane connectors. Accordingly, such techniques are well-suited for upgrading circuit board modules in backplane-based electronic systems without sacrificing any circuit board area (i.e., real estate) and/or any connectivity.

One embodiment of the invention is directed to an electronic system having a housing, a backplane disposed adjacent the housing, and an electronic apparatus configured to (i) install within the housing and (ii) connect to the backplane. The electronic apparatus includes a first assembly and a second assembly. Each assembly has a circuit board defining a front side and a back side, a set of connectors mounted to the front side of that circuit board, and a heat sink disposed over the front side of that circuit board. The heat sink is configured to provide cooling to that assembly. The electronic apparatus further includes a coupling mechanism that couples the first and second assemblies together in a substantially parallel manner. The sets of connectors of the assemblies form a connection interface to concurrently connect the first and second assemblies to a backplane.

BRIEF DESCRIPTION OF THE DRAWINGS

The foregoing and other objects, features and advantages of the invention will be apparent from the following description of particular embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

Embodiments of the invention are directed to techniques for connecting multiple circuit board assemblies to a backplane where the circuit boards of the assemblies are coupled together in a substantially parallel manner, and where connectors of the assemblies form a connection interface to concurrently connect the assemblies to the backplane. Such techniques enable large heat sinks to be disposed between the circuit boards for sufficient cooling of fast processing circuitry, and further enable the use of multiple columns of circuit board connectors to simultaneously connect with multiple columns of backplane connectors. As a result, such techniques are well-suited for upgrading circuit board modules in backplane-based electronic systems without sacrificing any circuit board real estate and/or any connectivity.

Figure 1:
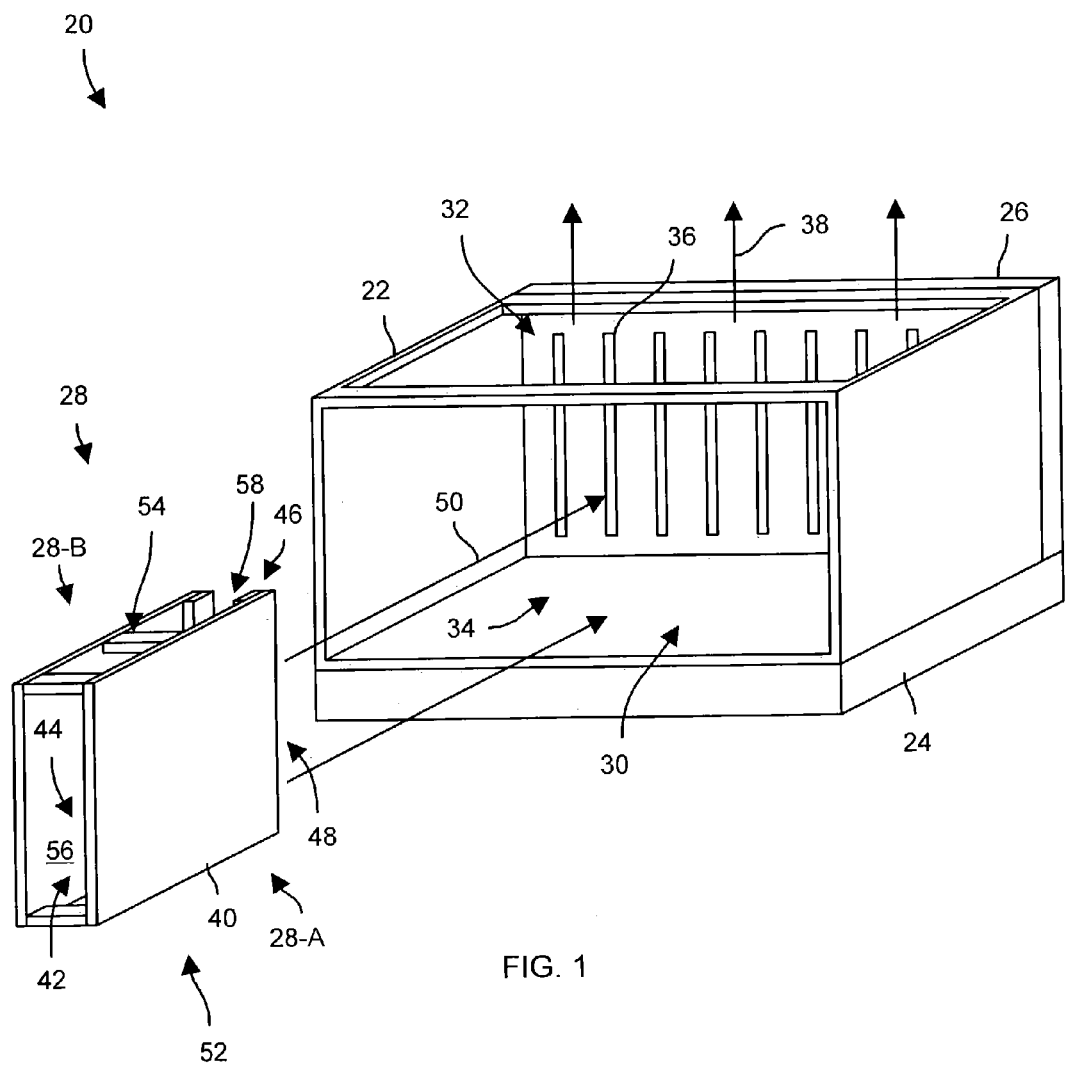
FIG. 1 is a perspective view of an electronic system which is suitable for use by the invention.

FIG. 1 shows an electronic system 20 which is suitable for use by the invention. The electronic system 20 includes a housing 22 (e.g., a card cage, a chassis, a frame, etc.), a fan assembly 24, a backplane 26, and a set of circuit board assemblies 28. The housing 22 defines a front opening 30, a back opening 32, and individual spaces 34 (e.g., slots, channels, etc.) to hold respective circuit board assemblies 28. The backplane 26 includes individual columns of backplane connectors 36 and resides adjacent the back opening 32 of the housing 22. In one arrangement, each column of backplane connectors 36 is a set of electrical connectors that provides electrical pathways to carry electrical signals. In another arrangement, each column of backplane connectors 36 is a set of fiber optic connectors that provides fiber optic pathways to carry light signals. In yet another arrangement, each column of backplane connectors 36 includes a combination of electrical and fiber optic connectors.

As shown in FIG. 1, the fan assembly 24 (i.e., one or more fans) is configured to provide an air stream 38 through the spaces 34 defined by the housing 22 to remove heat from the electronic system 20 when the electronic system is in operation. By way of example only, the fan assembly 24 resides at the bottom of the housing 22 and provides the air stream 38 in an upward direction (see the arrows 36 in FIG. 1). In other arrangements, the fan assembly 24 is in a different location (e.g., at the top or side of the housing 22) and/or provides the air stream 38 in a different direction (e.g., downward, horizontally, diagonally, etc.). In some of these other arrangements, the orientation of the circuit board assemblies 28 is different than that shown in FIG. 1 (e.g., the circuit board assemblies 28 extend horizontally or diagonally, etc.).

As further shown in FIG. 1, each circuit board assembly 28 includes a circuit board 40, a set of circuit board components 42 (shown generally by the arrow 42 in FIG. 1), a heat sink 44 (shown generally by the arrow 44 in FIG. 1), and a set of circuit board connectors 46. The set of circuit board connectors 46 mounts along a leading edge 48 of the circuit board 40 thus enabling the set of circuit board connectors 46 to connect with a corresponding column of backplane connectors 36 when the circuit board assemblies 28 install in a direction 50 within the housing 22.

As will be described in further detail shortly, an electronic apparatus 52 is formed by the combination of a first circuit board assembly 28-A, a second circuit board assembly 28-B and a coupling mechanism 54 (e.g., standoff members, rigid beams, assorted hardware, combinations thereof, etc.). The coupling mechanism 54 positions the assemblies 28-A, 28-B so that the assemblies 28-A, 28-B are substantially parallel to each other, and so that the assemblies 28-A, 28-B define a common space 56 therebetween. Additionally, the coupling mechanism 54 holds the assemblies 28-A, 28-B rigidly together so that the sets of circuit board connectors 46 along the leading edges 48 of the circuit boards 40 form a connection interface 58. The sets of circuit board connectors 46 of the connection interface 58 are configured to simultaneously connect to the backplane 24.

It should be understood that the common space 56 between the circuit board assemblies 28-A, 28-B enables the heat sinks 44 to be relatively large. Accordingly, the electronic apparatus 52 is well-suite for high power devices such as high speed processors that use large heat sinks, e.g., tall-finned heat sinks. As a result, there is no need to sacrifice either (i) space for a circuit board module (e.g., a circuit board assembly 28) or (ii) connectivity for the circuit board module when utilizing fast processing devices (e.g., high speed microprocessor chip sets) in the assemblies 28-A, 28-B. Further details of the invention will now be provided with reference to FIGS. 2 and 3.

Figure 2:
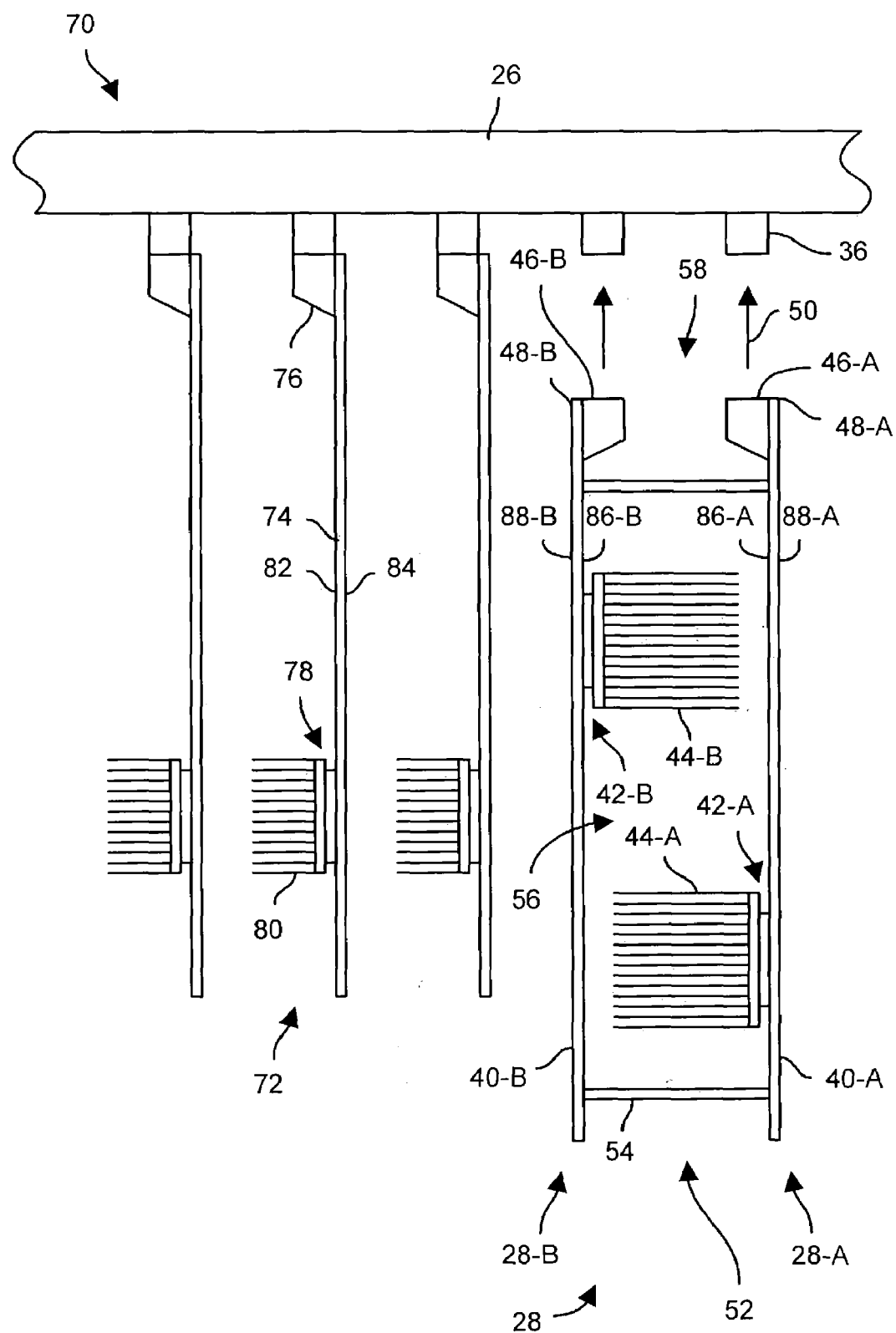
FIG. 2 is a top view of a portion of the electronic system when an electronic apparatus of the electronic system is about to connect with a backplane of the electronic system.

FIG. 2 is a top view of a portion 70 of the electronic system 20 when the electronic apparatus 52 is about to connect with the backplane 26. Here, the connection interface 5.8, which is formed by the sets of connectors 46 (see the connectors 46-A, 46-B of the assemblies 28-A, 28-B in FIG. 2), aligns with and is ready to engage with the corresponding sets of connectors 36 of the backplane 26 as the electronic apparatus 52 moves in the direction 50 toward the backplane 26. It should be understood that, at this time, each of the circuit board assemblies 28-A, 28-B resides in a respective individual space 34 of the housing 22 (also see FIG. 1).

As shown in FIG. 2, the heat sinks 44-A, 44-B and at least a portion of each set of connectors 46-A, 46-B reside within the common space 56 for efficient utilization of space. Furthermore, these circuit board components 44, 46 are well-protected against damage, e.g., external forces such as inadvertently hitting an external object, dropping, etc.

FIG. 2 further shows three uniformly-oriented conventional circuit board modules 72 which, by way of example only, already connect to the backplane 26. Each conventional circuit board module 72 includes, among other things, a circuit board 74, a column of circuit board connectors 76, a circuit board component 78 and a heat sink 80. The column of circuit board connectors 74 of each module 72 connects with a corresponding column of backplane connectors 36 when the module 72 resides in a space 34 of the housing 22 to provide connectivity between circuitry of the module 72 (e.g., the circuit board component 78) and the backplane 26. By way of example only, for each module 72, the connectors 76, the component 78 and the heat sink 80 reside over a front surface 82 of the circuit board 74 which is opposite a back surface 84 of the circuit board 74.

It should be understood that component 78 is, by way of example, a moderately powered microprocessor which is suitable for performing a set of operations (e.g., general purpose computing operations, data storage operations, network interface operations, etc.). The heat sink 80 is of moderate size and provides adequate cooling of the component 78 when the fan assembly 24 provides the air stream 38 (also see FIG. 1).

However, suppose that the owner of the electronic system 20 initially includes only the conventional circuit board modules 72 and now wishes to upgrade the electronic system 20 with faster circuitry (e.g., to increase the throughput of the electronic system 20, to perform certain complex tasks within a short amount of time that is unachievable by the component 78. To this end, suppose that the components 42 (see components 42-A, 42-B in FIG. 2) are high power processors that are well-suited for such a task. Further suppose that each component 42 requires use of the heat sink 44 which has longer fins that provide a taller profile to the heat sink 42 vis-à-vis the heat sink 80. Unfortunately, suppose that there is not enough clearance between the modules 72 to accommodate the heat sink 44, i.e., the distance between the front surface 82 of each module 72 and the back surface 84 of the next adjacent module 72 is too small to use the heat sink 44.

Rather than resolve to a more costs measure such as trading in the entire electronic system 20 or replacing the backplane 26, the user is capable of utilizing the electronic apparatus 52. That is, the user is capable of upgrading the electronic system 20 to use higher power, faster processing circuitry by removing two modules 72 and replacing those modules 72 with the electronic apparatus 52. There is no need to replace the backplane 26.

In the above-described situation, the electronic apparatus 52 is well-suited for use of the higher profile heat sinks 44. In particular, the circuit boards 40-A, 40-B of the circuit board assemblies 28-A, 28-B have front sides 86-A, 86-B over which the components 42-A, 42-B, the heat sinks 44-A, 44-B and the sets of connectors 46-A, 46-B are mounted, as well as back sides 88-A, 88-B which are opposite the front sides 86-A, 86-B (see FIG. 2). The front sides 86-A, 86-B face toward each other and define the common space 56. Since the front sides 86-A, 86-B face toward each other and since both the connectors 46 and the heat sinks 44 reside over the front sides 86-A, 86-B, the common space 56 is wide enough to accommodate the taller heat sinks 44-A, 44-B. Additionally, since the coupling mechanism 52 rigidly holds the two circuit board assemblies 28-A, 28-B together, the connection interface 58 formed by the sets of circuit board connectors 46-A, 46-B properly align and connect with their corresponding columns of backplane connectors 36 in a concurrent manner.

In one arrangement, the trace and circuitry layouts of the circuit board 40-B mirrors that of the circuit board 40A. That is, each circuit board 40-A, 40-B has a substantially different physical layout of electrical traces, components, etc. which are disposed in a mirroring manner. Accordingly, the manufacturer provides two different circuit board designs for the circuit boards 40-A, 40-B to enable the heat sinks 44-A, 44-B to reside in offsetting locations within the common space 56.

In another arrangement, the trace and circuit layouts of the circuit boards 40-A, 40-B are substantially the same (i.e., each circuit board 40-A, 40-B has a substantially matching physical layout of electrical traces, components, etc.), and the electrical pathways within the circuit board connectors 46-A, 46-B are different. Accordingly, the manufacturer essentially flips and rotates the circuit board 40-B in a mirroring manner and mounts special connectors 46-B to an opposite end of the circuit board 40-B to enable the heat sinks 44-A, 44-B to reside in offsetting locations within the common space 56.

In yet another arrangement, the trace and circuit layouts of the circuit boards 40-A, 40-B are substantially the same, and the connectors 46-A, 46-B are substantially the same. In this arrangement, the circuitry of each assembly 28-A, 28-B is configurable or programmable (e.g., via software, switches, etc.) to enable different usage of signal contacts of the connectors 46-A, 46-B. Again, the manufacturer essentially flips and rotates the circuit board 40-B in a mirroring manner and mounts same connectors 46 to an opposite end of the circuit board 40-B to enable the heat sinks 44-A, 44-B to reside in offsetting locations within the common space 56.

In yet another arrangement, the trace and circuit layouts of the circuit boards 40-A, 40-B are substantially the same, and the connectors 46-A, 46-B are also the same. In this arrangement, cables (e.g., electrical cables, fiber optic cables, etc.) direct the signals through the connectors 46 in a mirroring manner to enable the heat sinks 44-A, 44-B to reside in offsetting locations within the common space 56.

It should be understood that any of these configuration schemes, as well as others and combinations thereof, are suitable for use by various embodiments of the invention. Such schemes alleviate the need to redesign the backplane 26 and avoid having to change the positions of traces and contact locations on the backplane 26. Accordingly, these schemes enable a manufacturer to provide options and enhancements to both new customers as well as an already existing customer base.

As a result, the electronic apparatus 52 provides an upgrade path in which components 78 of conventional circuit board modules 72 can be replaced with higher power, faster components 42-A, 42-B of circuit board assemblies 28-A, 28-B. There is no circuit board real estate that must be sacrificed as in the above-described conventional module removal approach in which an adjacent circuit board is removed to provide more room for a larger heat sink 44. Additionally, no connectivity is sacrificed as in the above-described conventional piggy-back approach in which two circuit board modules are replace with a two-layer module that has only one column of circuit board connectors. Further details of the invention will now be provided with reference to FIG. 3.

Figure 3:
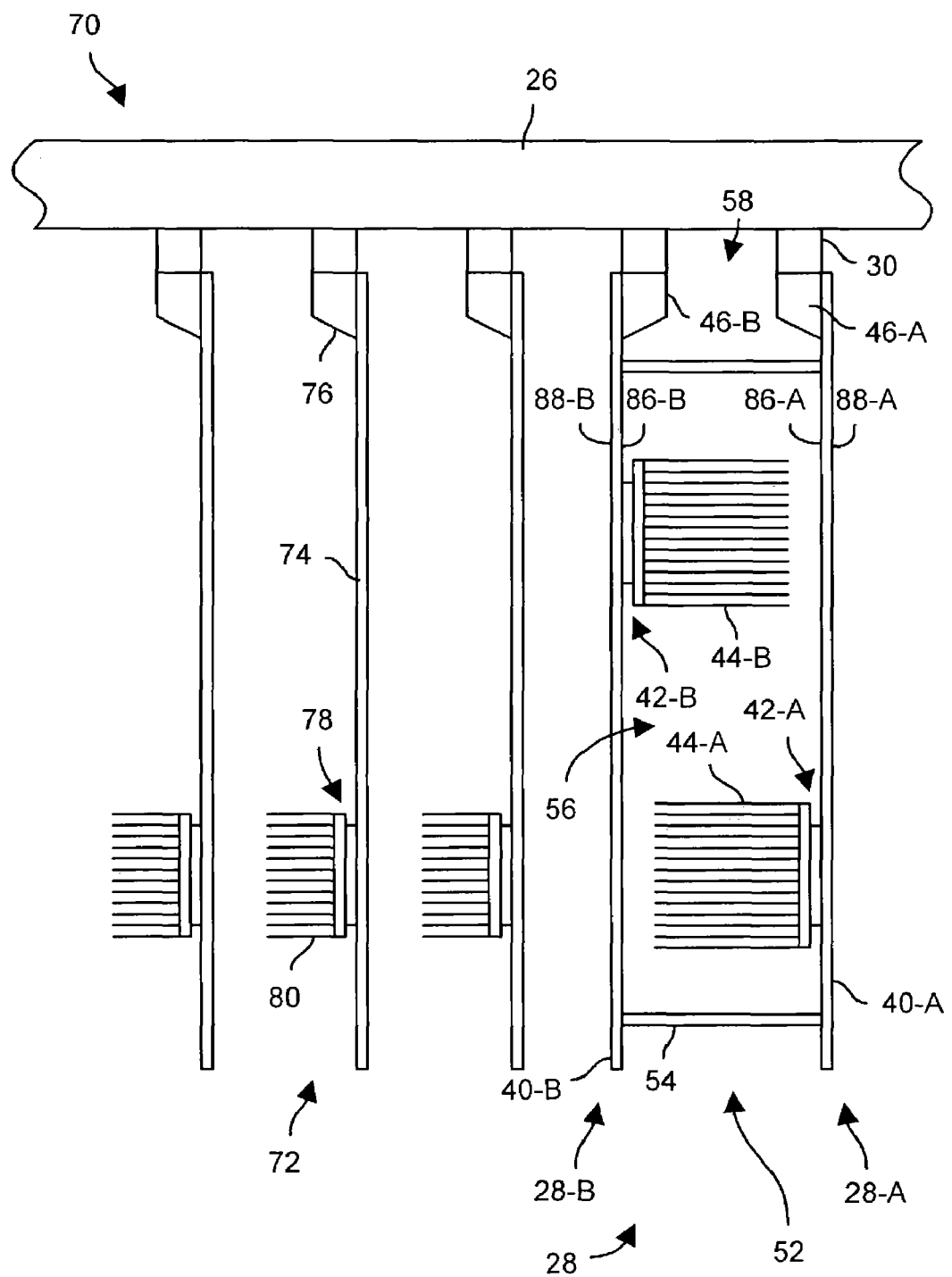
FIG. 3 is a top view of the electronic system portion of FIG. 2 when the electronic apparatus connects with the backplane.

FIG. 3 is a top view of the portion 70 of the electronic system 20 when the electronic apparatus 52 connects with the backplane 26. At this time, the set of connector 46 of each circuit board assembly 28 connects with the backplane 26. In particular, the set of connectors 46-A of the circuit board assembly 28-A connects with a first column of backplane connectors 36, and the set of connectors 46-B of the circuit board assembly 28-B simultaneously connects with a second column of backplane connectors 36. Accordingly, the common space 56 between the circuit boards 40-A, 40-B increases over the narrower space between conventional circuit boards 74 by at least the width of the connectors 46. Further space is obtainable by increasing the width of the connectors 46 or by adding risers between the connectors 46 and the circuit boards 40-A, 40-B.

When the electronic apparatus 52 is installed within the electronic system 20 as shown in FIG. 3, the tall heat sinks 44-A, 44-B are properly oriented within the housing 22 to enable the air stream 38 to reliably remove heat from the components 42 (also see FIG. 1). In one arrangement, fins of the tall heat sinks 44-A, 44-B align in a substantially parallel manner with the air stream 38 for thorough heat exchange between the components 42 and the air stream 38 through the fins (e.g., to provide substantial laminar flow).

It should be understood that the electronic system 20 provides flexibility so that both the electronic apparatus 52 is capable of coexisting with conventional circuit board modules 72 in a heterogeneous manner. Alternatively, the electronic system 20 supports a configuration in which there are no modules 72, and only the electronic apparatus 52 (e.g., multiple electronic apparatus 52). In either situation, the electronic system 20 facilitates continued utilization of resources since no real estate, no connectivity, and no spaces 34 of the housing 22 are lost. Further details of the invention will now be provided with reference to FIG. 4.

Figure 4:
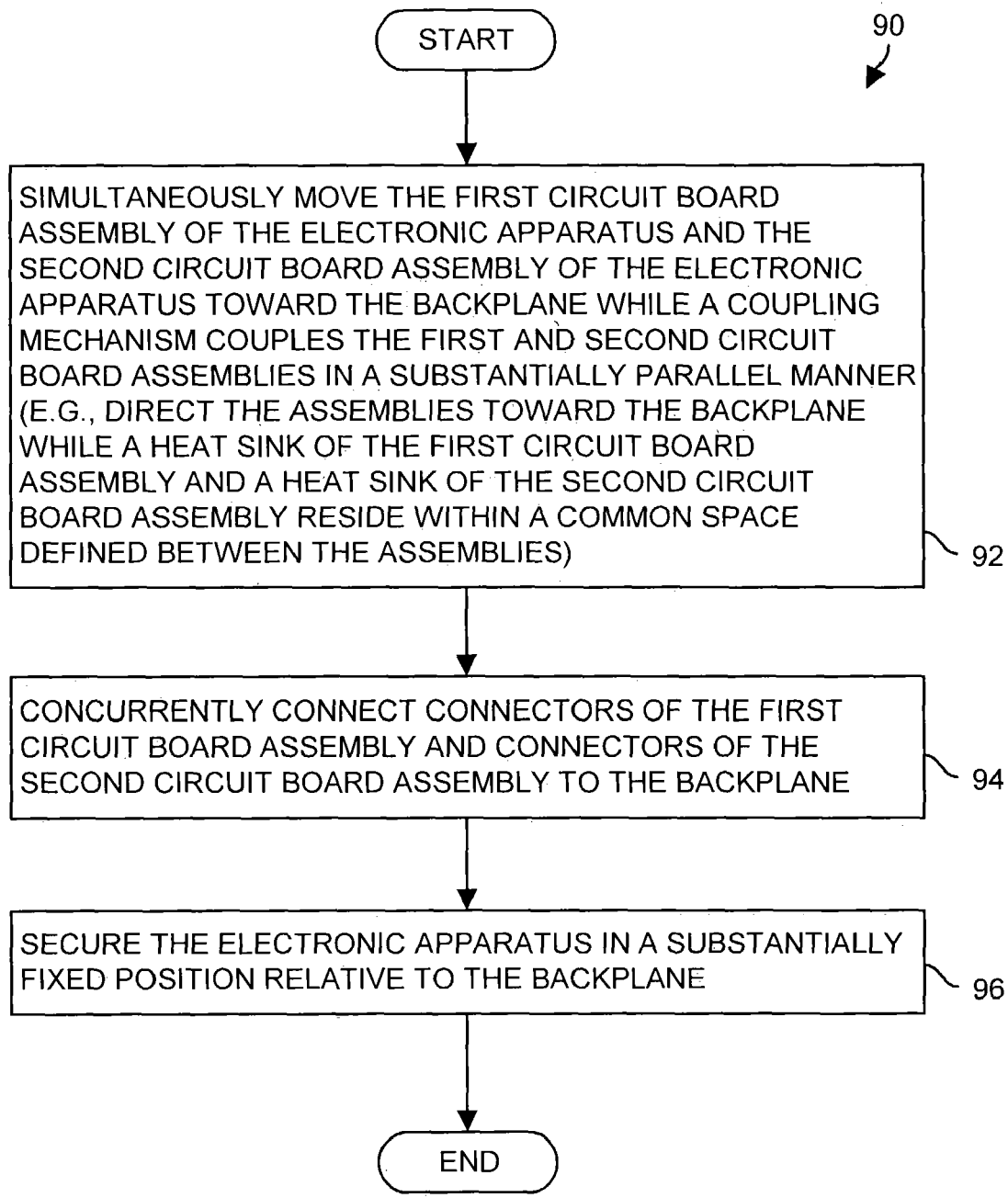
FIG. 4 is a flowchart of a procedure for connecting the electronic apparatus of FIGS. 2 and 3 to the backplane.

FIG. 4 is a flowchart of a procedure 90 for connecting the electronic apparatus 52 to the backplane 26. In step 92, a user (e.g., a technician) simultaneously moves the circuit board assemblies 28-A, 28-B of the electronic apparatus 52 toward the backplane 26. This is a relatively straightforward task since the coupling mechanism 54 (e.g., hardware) couples the circuit board assemblies 28-A, 28-B firmly together in a substantially parallel manner, and since the housing 22 defines individual spaces 34 (e.g., slots, channels, guide lanes, etc.) for receiving and supporting the assemblies 28-A, 28-B. As the user directs the assemblies 28-A, 28-B toward the backplane 26, the heat sinks 44-A, 44-B sit within the common space 56 where they are robustly mounted and protected against damage, e.g., bending or impinging on a component 42 due to an inadvertent force applied by the user against a heat sink 44-A, 44-B.

In step 94, the user concurrently connects the sets of circuit board connectors 46-A, 46-B of the circuit board assemblies 28-A, 28-B to the backplane 26. Again, due to coupling mechanism 54 having a secure hold on the assemblies 28-A, 28-B, the spacing of the sets of circuit board connectors 46-A, 46-B are at proper tolerances (e.g., there is tight tolerance control to avoid imprecision and misalignment otherwise caused by worst case tolerance stack-up) for reliable and consistent engagement between circuit board and backplane connectors 46, 36.

In step 96, the user secures the electronic apparatus 52 in a substantially fixed position relative to the backplane 26 (also see FIG. 3). In one arrangement, the user actuates a set of levers that locks the electronic apparatus 52 within the housing 22 thus preventing the electronic apparatus 52 from inadvertently disconnecting from the backplane 26 (e.g., preventing the electronic apparatus 52 from dislodging due to vibrations from the fan assembly 24, also see FIG. 1).

As described above, embodiments of the invention are directed to techniques for connecting multiple circuit board assemblies 28 to a backplane 26 where the circuit boards 40 of the assemblies 28 are coupled together in a substantially parallel manner, and where connectors 46 of the assemblies 28 form a connection interface 58 to concurrently connect the assemblies 28 to the backplane 26. Such techniques enable large heat sinks 44 (e.g., tall-finned heat sinks 44) to be disposed between the circuit boards 40 for sufficient cooling of fast processing circuitry (e.g., high speed microprocessor chip sets), and further enable the use of multiple columns of circuit board connectors 46 to simultaneously connect with multiple columns of backplane connectors 36. As a result, such techniques are well-suited for upgrading conventional circuit board modules 72 in backplane-based electronic systems without sacrificing any circuit board real estate and/or any connectivity. In particular, such techniques lend themselves well for both multi-drop bus and point-to-point architectures (electrical signal arrangements, fiber optic systems, etc.).

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. An electronic system, comprising:

a housing;

a backplane disposed adjacent the housing; and an electronic apparatus configured to install within the housing and connect to the backplane, the electronic apparatus having:

a first circuit board assembly which includes a first circuit board defining a first circuit board front side and a first circuit board back side, a first set of connectors mounted to the first circuit board front side of the first circuit board, and a first heat sink disposed over the first circuit board front side of the first circuit board, the first heat sink being configured to provide cooling to the first circuit board assembly;

a second circuit board assembly which includes a second circuit board defining a second circuit board front side and a second circuit board back side, a second set of connectors mounted to the second circuit board front side of the second circuit board, and a second heat sink disposed over the second circuit board front side of the second circuit board, the second heat sink being configured to provide cooling to the second circuit board assembly; and a coupling mechanism that couples the first circuit board assembly and the second circuit board assembly together in a substantially parallel manner, the first and second sets of connectors forming a connection interface to concurrently connect the first and second circuit board assemblies to the backplane.

2. The electronic system of claim 1 wherein the first circuit board front side of the first circuit board and second circuit board front side of the second circuit board face each other to define a common space therebetween; and wherein the first and second heat sinks reside within the common space.

3. The electronic system of claim 2 wherein at least a portion of the first set of connectors resides within the common space, wherein at least a portion of the second set of connectors resides within the common space, and wherein the first set of connectors is substantially parallel to the second set of connectors.

4. The electronic system of claim 3 wherein the first set of connectors includes a first column of circuit board contacts configured to connect with a first column of backplane contacts of the backplane, and wherein the second set of connectors includes a second column of circuit board contacts configured to connect with a second column of backplane contacts of the backplane.

5. The electronic system of claim 4 wherein the first circuit board includes a first physical layout of electrical traces, wherein the second circuit board includes a second physical layout of electrical traces that substantially matches the first physical layout of electrical traces of the first circuit board, wherein the first set of connectors includes a first physical layout of connecting pathways, and wherein the second set of connectors includes a second physical layout of connecting pathways that is different than the first physical layout of connecting pathways.

6. The electronic system of claim 4 wherein the first circuit board includes a first physical layout of electrical traces, wherein the second circuit board includes a second physical layout of electrical traces that is different than the first physical layout of electrical traces of the first circuit board, wherein the first set of connectors includes a first physical layout of connecting pathways, and wherein the second set of connectors includes a second physical layout of connecting pathways that substantially matches the first physical layout of connecting pathways.

7. The electronic system of claim 4 wherein the first and second circuit boards have substantially matching physical layouts of electrical traces, wherein the first and second sets of connectors have substantially matching physical layouts of connecting pathways, wherein the first circuit board assembly includes first switching circuitry to control routing of signals to the backplane through the first set of connectors, and wherein the second circuit board assembly includes second switching circuitry to control routing of signals to the backplane through the second set of connectors.

8. The electronic system of claim 1 wherein each of the first and second sets of connectors provides a set of electrical pathways.

9. The electronic system of claim 1 wherein each of the first and second sets of connectors provides a set of fiber optic pathways.

10. An electronic apparatus, comprising:
a first circuit board assembly which includes a first circuit board defining a first circuit board front side and a first circuit board back side, a first set of connectors mounted to the first circuit board front side of the first circuit board, and a first heat sink disposed over the first circuit board front side of the first circuit board, the first heat sink being configured to provide cooling to the first circuit board assembly;

a second circuit board assembly which includes a second circuit board defining a second circuit board front side and a second circuit board back side, a second set of connectors mounted to the second circuit board front side of the second circuit board, and a second heat sink disposed over the second circuit board front side of the second circuit board, the second heat sink being configured to provide cooling to the second circuit board assembly; and a coupling mechanism that couples the first circuit board assembly and the second circuit board assembly together in a substantially parallel manner, the first and second sets of connectors forming a connection interface to concurrently connect the first and second circuit board assemblies to a backplane.

11. The electronic apparatus of claim 10 wherein the first circuit board front side of the first circuit board and second circuit board front side of the second circuit board face each other to define a common space therebetween; and wherein the first and second heat sinks reside within the common space.

12. The electronic apparatus of claim 11 wherein at least a portion of the first set of connectors resides within the common space, wherein at least a portion of the second set of connectors resides within the common space, and wherein the first set of connectors is substantially parallel to the second set of connectors.

13. The electronic apparatus of claim 12 wherein the first set of connectors includes a first column of circuit board contacts configured to connect with a first column of backplane contacts of the backplane, and wherein the second set of connectors includes a second column of circuit board contacts configured to connect with a second column of backplane contacts of the backplane.

14. The electronic apparatus of claim 13 wherein the first circuit board includes a first physical layout of electrical traces, wherein the second circuit board includes a second physical layout of electrical traces that substantially matches the first physical layout of electrical traces of the first circuit board, wherein the first set of connectors includes a first physical layout of connecting pathways, and wherein the second set of connectors includes a second physical layout of connecting pathways that is different than the first physical layout of connecting pathways.

15. The electronic apparatus of claim 13 wherein the first circuit board includes a first physical layout of electrical traces, wherein the second circuit board includes a second physical layout of electrical traces that is different than the first physical layout of electrical traces of the first circuit board, wherein the first set of connectors includes a first physical layout of connecting pathways, and wherein the second set of connectors includes a second physical layout of connecting pathways that substantially matches the first physical layout of connecting pathways.

16. The electronic apparatus of claim 13 wherein the first and second circuit boards have substantially matching physical layouts of electrical traces, wherein the first and second sets of connectors have substantially matching physical layouts of connecting pathways, wherein the first circuit board assembly includes first switching circuitry to control routing of signals to the backplane through the first set of connectors, and wherein the second circuit board assembly includes second switching circuitry to control routing of signals to the backplane through the second set of connectors.

17. The electronic apparatus of claim 10 wherein each of the first and second sets of connectors provides a set of electrical pathways.

18. The electronic apparatus of claim 10 wherein each of the first and second sets of connectors provides a set of fiber optic pathways.

* * * * *